US006937036B1

(12) United States Patent
Sawhill, Jr. et al.

(10) Patent No.: US 6,937,036 B1
(45) Date of Patent: Aug. 30, 2005

(54) INTERFACE DEVICE AN INTERFACE BETWEEN TESTING EQUIPMENT AND AN INTEGRATED CIRCUIT

(75) Inventors: Robert Arthur Sawhill, Jr., Singapore (SG); Paren Indravadan Shah, Sunnyvale, CA (US)

(73) Assignee: Spire Technologies PTE Ltd., Singapore (SG)

( * ) Notice: Subject to any disclaimer, the term of this patent is extended or adjusted under 35 U.S.C. 154(b) by 0 days.

(21) Appl. No.: 09/980,055

(22) PCT Filed: May 28, 1999

(86) PCT No.: PCT/SG99/00048

§ 371 (c)(1),
(2), (4) Date: Apr. 17, 2002

(87) PCT Pub. No.: WO00/74108

PCT Pub. Date: Dec. 7, 2000

(51) Int. Cl.[7] .............................................. G01R 31/02
(52) U.S. Cl. ...................................... 324/754; 324/756
(58) Field of Search ................................ 324/754, 756, 324/761, 765, 72.1

(56) References Cited

U.S. PATENT DOCUMENTS

| | | | | |
|---|---|---|---|---|
| 3,944,922 A | * | 3/1976 | Chambers et al. | 324/761 |
| 4,812,745 A | * | 3/1989 | Kern | 324/754 |
| 4,847,553 A | * | 7/1989 | Seinecke | 324/756 |
| 5,532,613 A | | 7/1996 | Nagasawa | |
| 5,690,998 A | * | 11/1997 | Nagasawa et al. | 427/255.6 |
| 5,754,057 A | | 5/1998 | Hama et al. | |
| 6,356,089 B2 | * | 3/2002 | Bayer et al. | 324/754 |

FOREIGN PATENT DOCUMENTS

| | | | | |
|---|---|---|---|---|
| EP | 0262371 | | 4/1988 | |
| JP | 401028565 A | * | 1/1989 | G01R/31/28 |
| JP | 04145640 | | 5/1992 | |
| JP | 09281139 | | 10/1997 | |
| JP | 11038044 | | 2/1999 | |
| JP | 11142437 | | 5/1999 | |

* cited by examiner

*Primary Examiner*—David Zarneke
*Assistant Examiner*—Jermele Hollington
(74) *Attorney, Agent, or Firm*—Ostrolenk, Faber, Gerb & Soffen, LLP

(57) ABSTRACT

An interface device provides an interface between testing equipment and an integrated circuit to be tested. The interface device includes a body member. A number of elongate contact members are mounted on the body member. Each contact member includes a contact end, adapted to contact a bond pad of the integrated circuit to be tested, and a body portion. The interface device also includes a guide member mounted on the body member. The guide member includes a substantially planar member having a number of apertures therein, and the contact end of each elongate member extending through a respective aperture in the guide member.

6 Claims, 2 Drawing Sheets

INTERFACE DEVICE AN INTERFACE BETWEEN TESTING EQUIPMENT AND AN INTEGRATED CIRCUIT

The invention relates to an interface device for providing an interface between testing equipment and an integrated circuit to be tested using the testing equipment.

BACKGROUND OF THE INVENTION

A probe card is used in semiconductor wafer fabrication and/or packaging facilities to test the integrity of every semiconductor chip (or die) produced. The process of testing involves testing equipment referred to as "probers" and an interface device that couples the testing equipment to the die to be tested. The interface device is commonly known as a "prove card". The probe card generally comprises a large number of probes, which take the form of pins. The pins are arranged on a printed circuit board, or other support structure, in a pattern that corresponds to the layout of the bonding pads on the die to be tested. Each die requires a probe card with a pin pattern that is specific to the layout of the bond pads on the die.

Test signals are exchanged between the prober and the die via the probe card and in particular, the pins that contact the bond pads on the die to be tested. The quality of signals received by the prober from the die is dependent on the quality of the probe card and the quality of contact between the pins and the bond pads on the die.

Conventional probe cards comprise a number of cantilevered probes fixed by epoxy resin to a ceramic or aluminium retaining ring. Typically, the free end of each cantilevered probe (ie the tip which contacts the bond pad) is overhanging the retaining ring by approximately 5 mm to 6 mm and there is an average pitch (ie spacing between the tips) of between 80 μm to 200 μm.

However, as chip geometries and resulting bond pad pitches are getting smaller and smaller (currently about 50 μm) it is becoming increasingly difficult to design and build probecards using conventional cantilever pin designs.

Therefore, in order to achieve smaller probe pitches, smaller diameter wire is being used to manufacture the probes. However, using thinner wire has the disadvantage that the probes are substantially weaker and the overhanging cantilevered design of the probes makes them susceptible to lateral deflections at the tip. Therefore, the tips can not reliably maintain the correct x-y position. This has the risk that the tip may not contact the correct bond pad on the die during testing, resulting in the prober possibly giving an incorrect test result.

BRIEF SUMMARY OF THE INVENTION

In accordance with a first aspect of the present invention, an interface device for providing an interface between testing equipment and an integrated circuit to be tested comprises a body member; a number of elongate contact members, each elongate contact member comprising a contact end, adapted to contact a bond pad of an integrated circuit to be tested, and a body portion coupled to the body member; and a guide member mounted on the body member, the guide member comprising a substantially planar member having a number of apertures therein, the contact end of each elongate member extending through a respective aperture in the guide member, and the width of each contact end being less than the width of the respective aperture to permit lateral movement of each contact end within the respective aperture.

An advantage of the invention is that, as the contact end of each elongate member extends through a respective aperture in the guide member, the guide member limits lateral displacement of the contact ends.

Preferably, the planar member is manufactured from a glass material, such as borosilicate glass.

In accordance with a second aspect of the present invention, an elongate member for an interface device for providing an interface between testing equipment and an integrated circuit to be tested comprises a body portion and a contact end, the contact end adapted to contact a bond pad on an integrated circuit to be tested, and the contact end having a friction reducing coating.

Preferably, the tip surface of the contact end is coated with the friction reducing coating.

Typically, the coating may be a hard coating, such as chrome nitride or titanium nitride.

Preferably, the elongate members in the first aspect are the elongate members in accordance with the second aspect of the invention. Typically, where the elongate members in the first aspect are in accordance with the elongate members in the second aspect, the side surfaces of the contact ends are coated with the friction reducing coating. This has the advantage of reducing friction between the side surfaces of the contact ends and the inside surfaces of the apertures in the guide member.

Preferably, the interface device further comprises a printed circuit board to which the ends of the contact members opposite to the contact ends are coupled and the printed circuit board is adapted to permit the testing equipment to be coupled to the printed circuit board.

Preferably, the elongate contact member may be formed from metal wire with a diameter of 1 mil to 10 mil (25 μm to 250 μm) and is preferably in the region of 2 mil to 10 mil (50 μm to 250 μm). Typically, the contact surface of the contact ends may have a diameter of approximately 0.5 mil to 5 mils (12.5 μm to 125 μm) and preferable 1 mil to 2.5 mils (25 μm to 62.5 μm). The contact surface may be either planar or curved. Preferably, the contact members may be tungsten, beryllium copper, palladium, paliney or an alloy of two or more of these materials.

In accordance with a third aspect of the invention, a method of forming a through bore in a piece of material comprises generating a substantially parallel beam of coherent light, illuminating an object having a substantially circular cross section with a diameter less than the diameter of the beam with the substantially parallel beam to form an annular beam, and focusing the annular beam onto the piece of material so that the annular beam incident on the piece of material has an external diameter corresponding to that of the desired through bore to burn away a corresponding annular piece of material to form the through bore.

Preferably, the coherent light is generated be a laser, which may be an excimer laser. Typically, the light generated by the excimer laser has a wavelength of approximately 193 nm.

Typically, the object having the circular cross section may be a spherical object, such as a steel ball. Preferably, the object reflects the light incident on it to minimise heating of the object.

Typically, the through bore to be formed in the piece of material has a diameter less than 100 μm and may be from 10 μm to 100 μm.

Preferably, the apertures in the guide member in the first aspect of the invention are formed using the method in accordance with the third aspect of the invention.

An example of an interface device in accordance with the invention will now be described with reference to the accompanying drawings, in which:

DETAILED DESCRIPTION OF THE INVENTION

Figure 1:
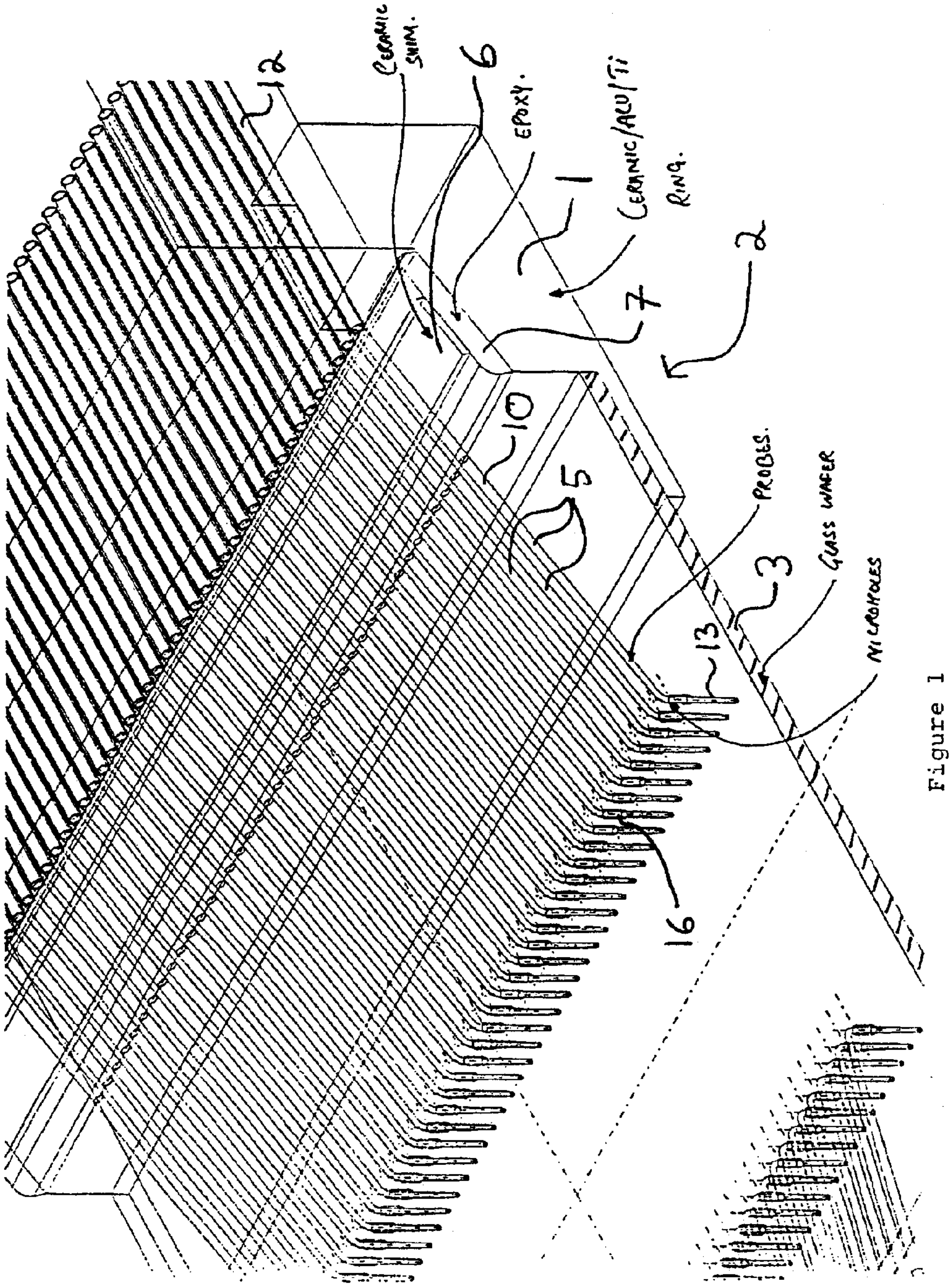
FIG. 1 is a schematic perspective view of a section of an interface device including a guide member.

FIG. 1 shows a schematic view of a portion of a probe card 2. The probe card 2 includes a ring 1 formed from ceramic, aluminum or titanium, a guide member in the form of a glass wafer 3 and a number of contact pins 5 mounted on the ring I by means of a ceramic shim 6 and epoxy resin 7.

Figure 2:
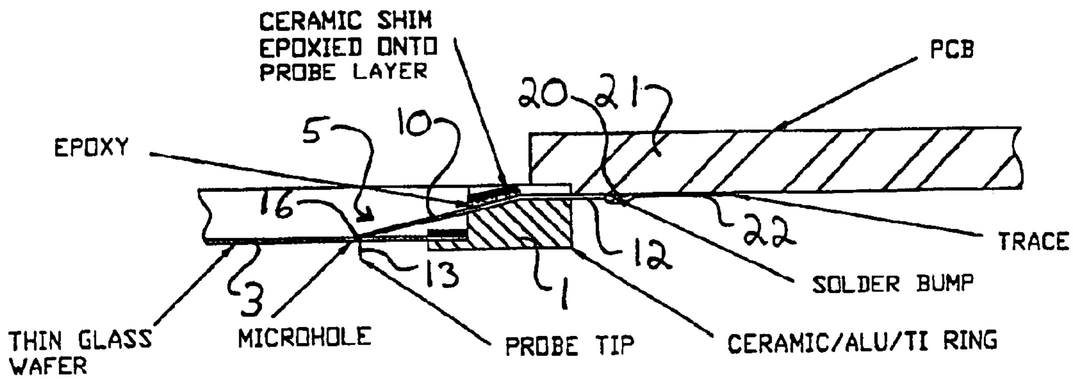
FIG. 2 is a side view of a portion of the interface device.

As shown in more detail in FIG. 2, each of the contact pins 3 comprises a central body portion 10 which rests on and is fixed to the ceramic shim 6, a contact end 13 and a PCB end 12 which is electrically coupled by solder 20 to a trace 22 on a printed circuit board PCB) 21.

The contact pins 5 are typically manufactured from a metal wire such as tungsten, beryllium copper, palladium, paliney alloy or any other suitable metal material. The contact pins 5 can also be comprised of a suitable base metal with another metal coated on this base metal. The wire diameter is typically in the region of 1 mil to 10 mil (25 μm to 250 μm) and the surface of the contact end 13 may have a diameter of approximately 1 mil to 2.5 mil (25 μm to 62.5 μm) with a flat or curved surface. In addition, the contact end 13 is etched to form a taper.

The glass wafer 3 is typically a borosilicate glass and has micro holes 16 therein which may be formed by laser drilling, and the contact end 13 protrudes through the micro holes 16.

Preferably, the contact ends 13 of the pins 5 are coated with a hard coating, such as chrome nitride or titanium nitride. This has the advantage of reducing friction between the contact surface or tip of the contact pins and the bond pads on a die being tested, which improves tip life. In addition, if the sides of the contact ends 13 are also coated, this reduces friction between the sides of the contact ends and the inside surfaces of the apertures 16.

Figure 3:
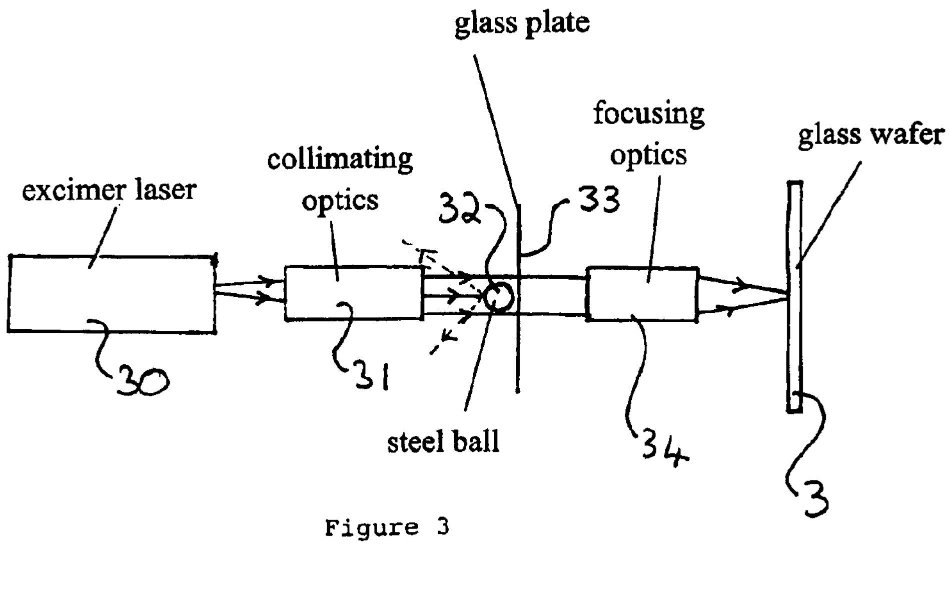
FIG. 3 is a schematic view of apparatus for forming apertures in the guide member forming part of the interface device shown in FIGS. 1 and 2.

Preferably, the laser drilling is performed using an optical arrangement as shown in FIG. 3. An excimer laser 30 emits light with a wavelength of 193 nm and an energy of 200 mJ per pulse. The light beam from the laser is then collimated by collimating optics 31 to form a collimated beam of light with a circular cross-section. A steel ball 32 is fixed to a glass plate 33. The steel ball 32 has a diameter which is less than that of the output beam from the collimating optics. Therefore, when the centre of the collimated beam strikes the center of the steel ball, the central portion of the collimated beam is reflected and scattered from the steel ball but the outermost section of the collimated beam passes by the steel ball 32 undeviated and passes through the glass plate 33. Hence, the steel ball 32 forms an optical mask, the output beam from which is a collimated annular beam. The collimated annular beam is then focused by focusing optics 34 onto the glass wafer 3 to burn an annular ring in the glass wafer 3 to form an aperture 16.

In order to form an aperture 6, the laser 30 typically operates at a pulse rate of 50 Hz for 20 s. However, this will depend on a number of factors such as the thickness of the wafer 3 and the type of glass from which the wafer 3 is formed.

The invention has the advantages that by using the glass wafer 3 as a guide member, the apertures 16 limit lateral displacement of the contact ends 13. This permits thinner diameter wire to be used for the pins 5 which enables higher pitch densities for the pins 5 to be achieved while still maintaining the lateral position of the contact ends.

In addition, as the axis of the apertures 16 is substantially vertical, vertical movement of the contact ends 13 is not affected by the presence of the glass wafer 3.

What is claimed is:

1. An interface device for providing an interface between testing equipment and an integrated circuit to be tested, the interface device comprising:

a body member;

a number of elongate contact members, each elongate contact member comprising a metal wire with a diameter of less than or equal to 10 mil (250 μm) having a contact end adapted to contact a bond pad of an integrated circuit to be tested, and a body portion coupled to the body member; and a guide member mounted on the body member, the guide member comprising a substantially planar member comprised of glass material and having a number of apertures therein, the contact end of each elongate member extending through a respective aperture in the guide member, and the width of each contact end being less than the width of the respective aperture to permit lateral movement of each contact end within the respective aperture.

2. An interface device according to claim 1, wherein the elongate contact member is formed from metal wire with a diameter of 1 mil to 10 mil (25 μm to 250 μm).

3. An interface device according to claim 2, wherein the elongate contact member has a diameter of between 1 mil to 6 mils (25 μm to 150 μm).

4. An interface device according to claim 1, wherein the glass material is borosilicate glass.

5. An interface device according to claim 1, wherein the elongate members for an interface device for providing an interface between testing equipment and an integrated circuit to be tested, the elongated member comprising a body portion and a contact end, the contact end adapted to contact a bond pad on an integrated circuit to be tested, and the contact end having a friction reducing coating.

6. An interface device according to claim 5, wherein the side surfaced of the contact ends are coated with the friction reducing coating.

* * * * *

UNITED STATES PATENT AND TRADEMARK OFFICE

CERTIFICATE OF CORRECTION

PATENT NO. : 6,937,036 B1
DATED : August 30, 2005
INVENTOR(S) : Robert Arthur Sawhill, Jr. and Paren Indravadan Shah It is certified that error appears in the above-identified patent and that said Letters Patent is hereby corrected as shown below:

Title page,
Insert Item -- [73] Assignee: Spire Technologies Pte Ltd. --.

Signed and Sealed this

Twenty-seventh Day of December, 2005

JON W. DUDAS
*Director of the United States Patent and Trademark Office*